United States Patent
Zeng et al.

(10) Patent No.: US 9,620,448 B1
(45) Date of Patent: Apr. 11, 2017

(54) POWER MODULE

(71) Applicant: DELTA ELECTRONICS (SHANGHAI) CO., LTD., Shanghai (CN)

(72) Inventors: Jianhong Zeng, Shanghai (CN); Shouyu Hong, Shanghai (CN); Min Zhou, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 15/272,658

(22) Filed: Sep. 22, 2016

(30) Foreign Application Priority Data

Mar. 3, 2016 (CN) .......................... 2016 1 0120592

(51) Int. Cl.
| | |
|---|---|
| H01L 29/00 | (2006.01) |
| H01L 23/522 | (2006.01) |
| H01L 49/02 | (2006.01) |
| H02M 7/00 | (2006.01) |
| H01L 23/31 | (2006.01) |

(52) U.S. Cl.
CPC .......... *H01L 23/5227* (2013.01); *H01L 23/31* (2013.01); *H01L 28/10* (2013.01); *H02M 7/003* (2013.01)

(58) Field of Classification Search
CPC ..... H01L 23/31; H01L 23/5227; H01L 28/10; H02M 7/003

USPC ......................................................... 257/531
See application file for complete search history.

(56) References Cited

U.S. PATENT DOCUMENTS

| 2005/0024838 A1* | 2/2005 | Maxwell | H01L 23/5385 361/782 |
|---|---|---|---|
| 2005/0270745 A1* | 12/2005 | Chen | H01F 27/2804 361/707 |
| 2005/0270806 A1* | 12/2005 | Zhu | H02M 3/33576 363/17 |
| 2008/0272658 A1* | 11/2008 | Kojori | H02M 1/08 307/129 |

* cited by examiner

Primary Examiner — David S Blum
(74) Attorney, Agent, or Firm — Kirton McConkie; Evan R. Witt

(57) ABSTRACT

A power module is disclosed. The power module includes a magnetic assembly, a switching device, a first upper conductive element and a first sidewall conductive element. The magnetic assembly has a first magnetic core, a second magnetic core and a receiving space. The first magnetic core has a first top surface, a first bottom surface and at least one first sidewall through-hole. The second magnetic core is coupled with the first magnetic core. The receiving space is formed between the first magnetic core and the second magnetic core. The switching device is disposed on the first top surface and accommodated in the receiving space. The first upper conductive element is disposed on the first top surface of the first magnetic core and electrically connected to the switch component. The first sidewall conductive element is disposed in the first sidewall through-hole and electrically connected to the first upper conductive element.

20 Claims, 22 Drawing Sheets

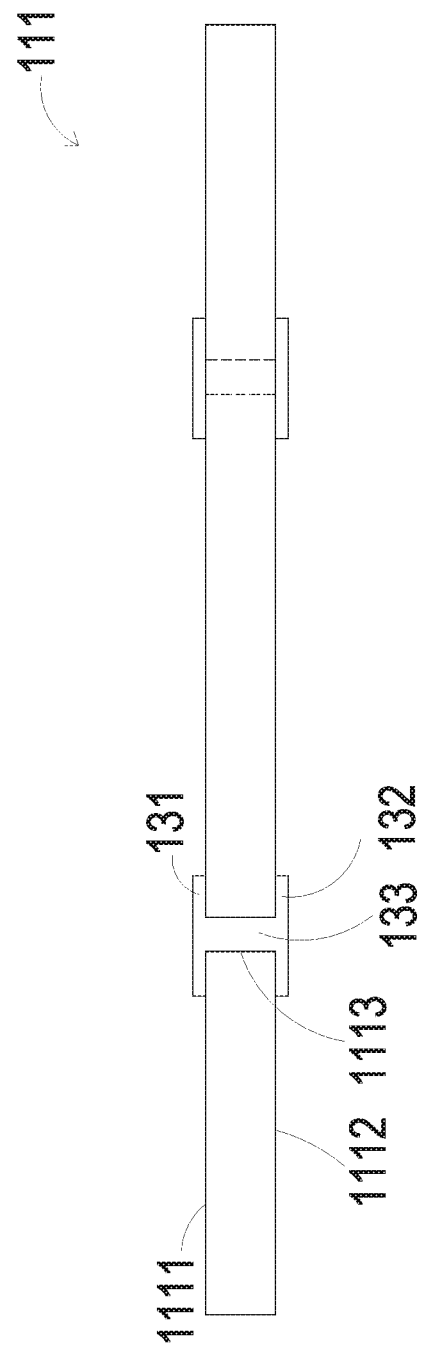

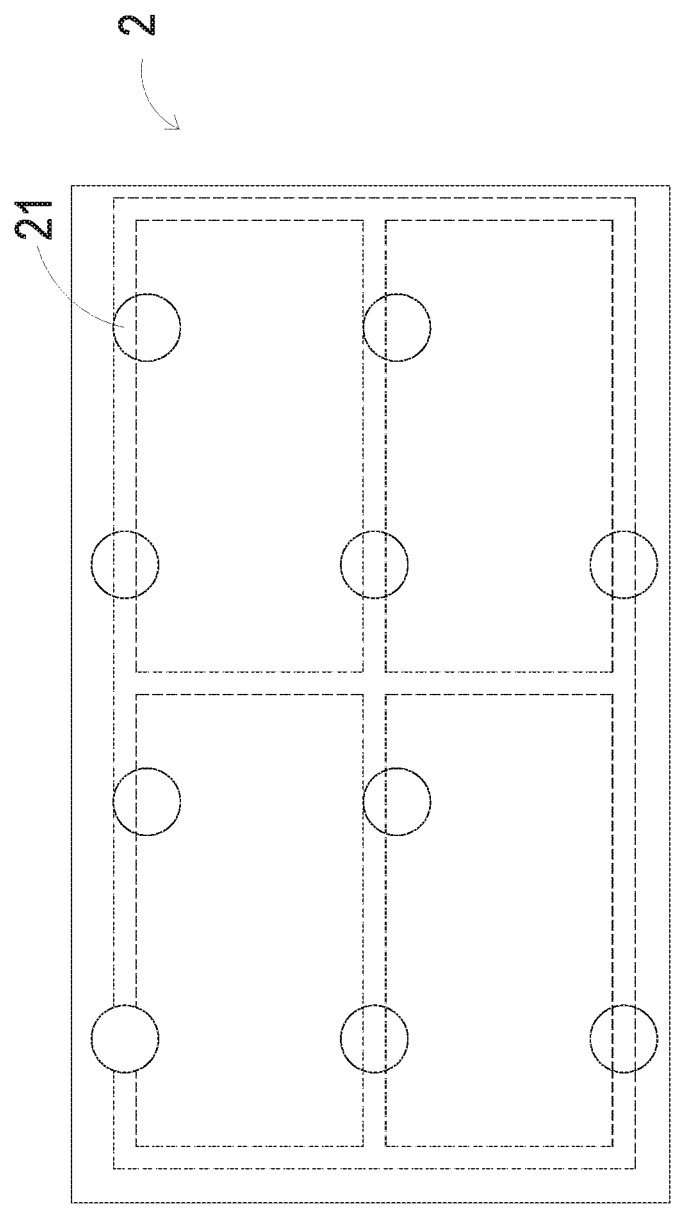

POWER MODULE

FIELD OF THE INVENTION

The present invention relates to a power module, and more particularly to a powder module having an integrated magnetic assembly.

BACKGROUND OF THE INVENTION

With the increasing requests of human intelligent life, the increasing requirements of developing intelligent products, and the growing of Internet of Things (IoT), the requirements of data transmission and processing are increasing day by day. In a centralized data processing center, servers are regarded as key elements and have motherboards including CPU, chipsets, memories, and equivalent digital chips for data processing with power supplies and necessary peripheral elements. For increasing the processing capacity of servers in a unit volume, the number of digital chips and the density of integration are increased correspondingly. Consequently, the ratio of occupied space and the power loss are increased. Therefore, the power supply (also called as motherboard power due to that the power supply and the digital chips are disposed on the same motherboard) employed by the system for providing power to the digital chips is expected to have higher efficiency, higher power density and smaller occupied space, so as to facilitate the entire server and even the entire data center to save energy and minimize the occupied area.

Generally, the power with the low voltage and the large current is provided to the digital chips mentioned above. For reducing the influences of power loss and impedance of the output wire, power supplies which are capable of providing power to the digital chips are directly disposed on the motherboard and located as close as possible to the digital chips. Therefore, the power supply which is capable of providing power to the digital chip directly is called as a point of the load (POL) power supply. The above-mentioned power supply has an input power provided from other power source. The typical POL power supply has an input voltage about 12 volts.

On the other hand, for achieving the applications in a distributed portable data processing terminals, the constituent elements and the digital chips have to be integrated into a small space and keep working for a long time. In addition, lower operating voltage is provided to the constituent elements and the digital chips. Generally, the lower operating voltage is provided by an energy storage device such as 3V to 5V battery. Therefore, the power supply tends to be requested with a high efficiency and a high power density.

At present, in a low-voltage DC/DC converter, a buck converter is usually employed to provide various output voltages ranged from 0 volt to 5 volts for the corresponding digital chips. FIG. 1 shows a circuit diagram of a typical buck converter. As shown in FIG. 1, the buck converter includes an input filter capacitor Cin, a main switching element Q1, an auxiliary switching element Q2, an inductor L and an output capacitor Co. The input filter capacitor Cin is electrically connected with a power source for receiving an input voltage Vin. The main switching element Q1 performs a turn-on and turn-off operation to adjust the output voltage Vo and the output current Io. The output current Io of the buck converter is provided to a load RL, i.e. the digital chip or a CUP.

For improving the properties of the power module, the current industry tends to optimize the semi-conductors and the inductors L significantly. Although both of them are optimized to a considerable degree, the optimization chance is getting smaller so that the further optimization is limited.

Therefore, there is a need of providing a new power module in order to overcome the above drawbacks encountered by the prior arts.

SUMMARY OF THE INVENTION

The present invention provides a power module. The magnetic assembly and the switching device are integrated at the same time, so that the power module with high efficiency and high powder density is achieved. The occupied space of the power module relative to the system motherboard can be decreased, so that the product with the power module is more competitive.

The present invention further provides a power module. The magnetic assembly and the switching device are integrated together, so as to simplify the manufacturing process, increase the design flexibility, optimize the electrical circuit characteristics of the power module and integrate more functions in the power module.

The present invention further provides a power module including a magnetic assembly having two magnetic cores. The magnetic assembly has an air gap disposed between the two magnetic cores for adjusting the properties thereof, and the combination of the two magnetic cores can decrease the depth of through-holes and increase the wiring density. On the other hand, the magnetic assembly is utilized as a substrate, so as to provide the mechanical strength, decrease the entire thickness of the power module, simplify the manufacture process and enhance the competitiveness of the products.

In accordance with an aspect of the present invention, there is provided a power module. The power module includes a magnetic assembly, a switching device, a first upper conductive element and a first sidewall conductive element. The magnetic assembly includes a first magnetic core, a second magnetic core and a receiving space. The first magnetic core has a first top surface, a first bottom surface and at least one first sidewall through-hole. The second magnetic core is coupled with the first magnetic core. The receiving space is formed between the first magnetic core and the second magnetic core. The switching device is disposed on the first top surface of the first magnetic core and accommodated in the receiving space. The first upper conductive element is disposed on the first top surface of the first magnetic core and electrically connected to the switching device. The first sidewall conductive element is disposed in the first sidewall through-hole and electrically connected to the first upper conductive element.

The present invention further provides a power module having a magnetic assembly, a switching device, a first upper conductive element, a first lower conductive element and a first sidewall conductive element. The magnetic assembly has a receiving space, a first top surface, a first bottom surface and at least one first sidewall through-hole. The first top surface is opposite to the first bottom surface, and the first sidewall through-hole is connected between the first top surface and the first bottom surface. The receiving space is formed on the first top surface. The switching device is disposed on the first top surface and accommodated in the receiving space. The first upper conductive element is disposed on the first top surface and electrically connected to the switching device. The first lower conductive element is disposed on the first bottom surface. The first sidewall conductive element is disposed in the first sidewall through-hole and electrically connected between the first upper conductive element and the first lower conductive element.

The above contents of the present invention will become more readily apparent to those ordinarily skilled in the art after reviewing the following detailed description and accompanying drawings, in which:

BRIEF DESCRIPTION OF THE DRAWINGS

FIG. 3A is a schematic cross-sectional view illustrating the first magnetic core of the power module shown in FIG. 2;

FIGS. 4A to 4C schematically illustrate the structure of the power module in different steps according to a manufacturing process of the present invention;

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
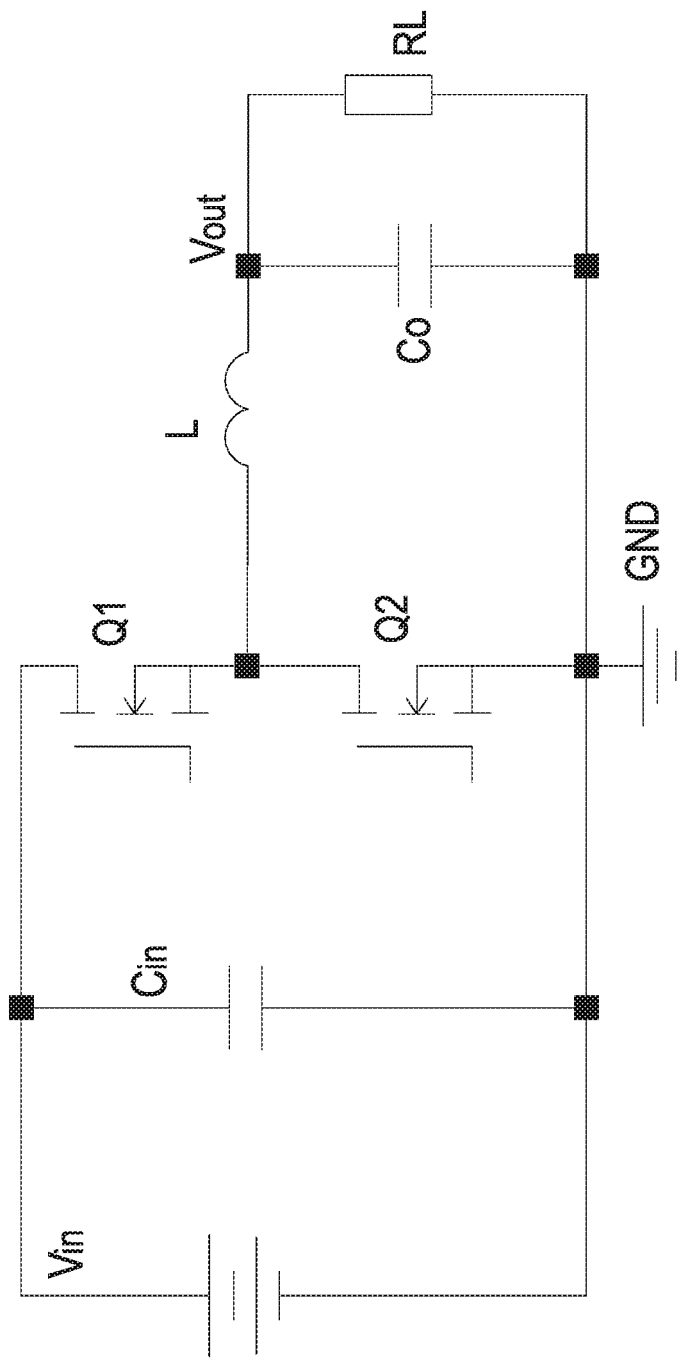
FIG. 1 shows a circuit diagram of a typical buck converter.
Figure 2:
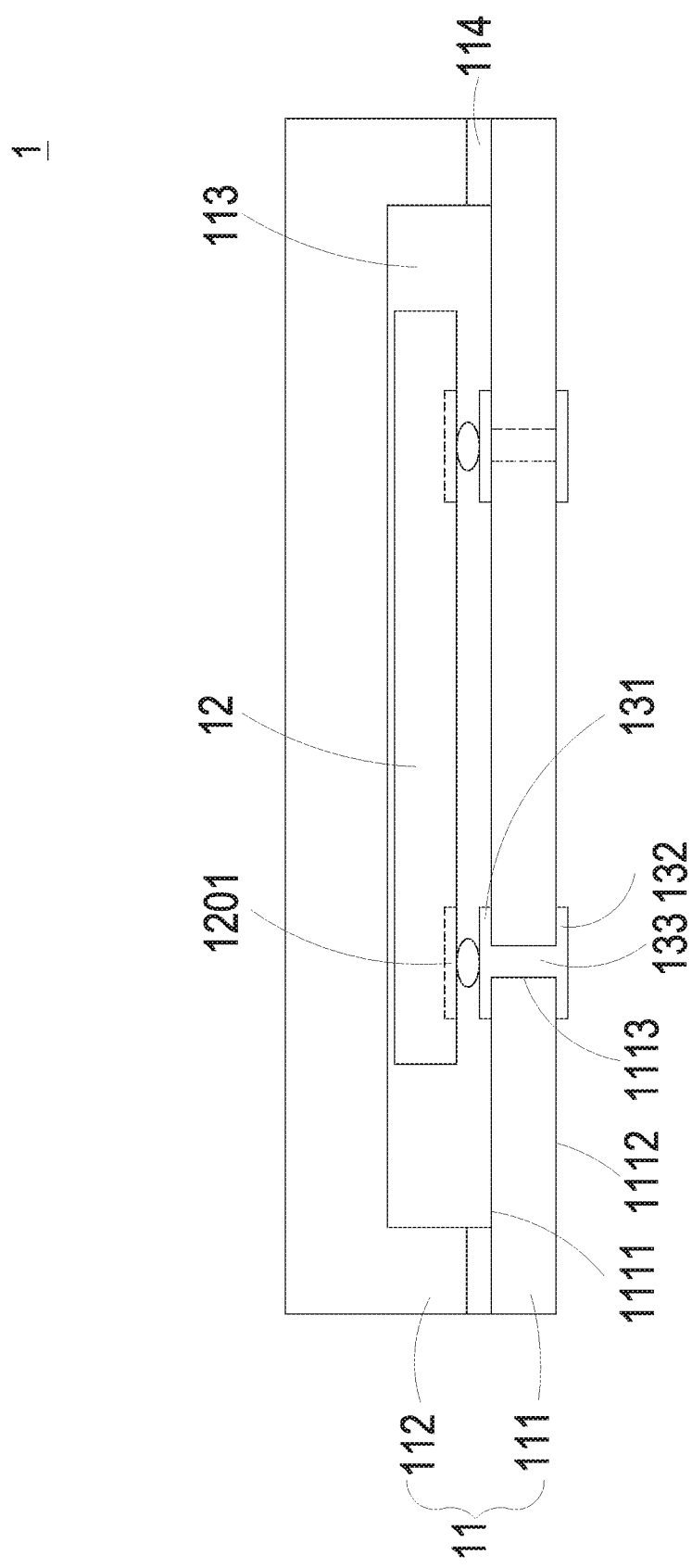
FIG. 2 is a schematic cross-sectional view illustrating a power module according to a first embodiment of the present invention.

FIG. 2 is a schematic cross-sectional view illustrating a power module according to a first embodiment of the present invention. As shown in FIG. 2, the power module 1 includes a magnetic assembly 11, a switching device 12, a first upper conductive element 131, a first lower conductive element 132 and a first sidewall conductive element 133. In the embodiment, the magnetic assembly 11 includes a first magnetic core 111, a second magnetic core 112 and a receiving space 113. The first magnetic core 111 and the second magnetic core 112 are assembled with each other via an adhesive material 114 so as to form the magnetic assembly 11. Accordingly, the property, such as the inductance value, of the magnetic assembly 11 is adjustable by means of adjusting the thickness of the adhesive material 114, so as to create more variety of the design modification. The first magnetic core 111 includes a first top surface 1111, a first bottom surface 1112 and at least one sidewall through-hole 1113. The second magnetic core 112 is coupled with the first magnetic core 111. The receiving space 113 is formed between the first magnetic core 111 and the second magnetic core 112 and disposed over the first top surface 1111. The switching device 12 is disposed on the first top surface 1111 of the first magnetic core 111 and accommodated in the receiving space 113. Namely, the volume and the size of the switching device 12 are smaller than those of the receiving space 113 formed between the first magnetic core 111 and the second magnetic core 112, so that the switching device 12 is completely accommodated in the receiving space 113. In addition, the first upper conductive element 131 of the power module 1 is disposed on the first top surface 1111 of the first magnetic core 111 and electrically connected to a first electrode 1201 of the switching device 12. The first lower conductive element 132 is disposed on the first bottom surface 1112 of the first magnetic core 111. The first sidewall conductive element 133 is disposed in the first sidewall through-hole 1113 and electrically connected between the first upper conductive element 131 and the first lower conductive element 132. Consequently, the switching device 12 is integrated and accommodated in the receiving space 113 of the magnetic assembly 11. Through an electrically conductive path of the first electrode 1201, the first upper conductive element 131, the first sidewall conductive element 133 and the first lower conductive element 132, the input and output of the switching device 12 are performed. Alternatively, the electrically conductive path runs through a horizontal window of the magnetic assembly 11 partially, so that the first electrode 1201 of the switching device 12, the first upper conductive element 131, the first sidewall conductive element 133 and the first lower conductive element 132 can be constructed as a winding turn of the magnetic assembly 11. In the embodiment, the switching device 12 can be a controllable component or an uncontrollable component, for example but not limited to MOSFET (Metal-Oxide-Semiconductor Field-Effect Transistor), IGBT (Insulated Gate Bipolar Transistor), GaN HEMT (High-Electron-Mobility Transistor) or a diode. Alternatively, at least one switching device 12 can be integrated with at least one passive component and accommodated in the receiving space 113 of the magnetic assembly 11, so as to utilize the receiving space 113 of the magnetic assembly 11 efficiently and accomplish a package with high power density according to the application requirements.

In the embodiment, the magnetic assembly 11 further includes an adhesive material 114 disposed on portion of the first top surface 1111 of the first magnetic core 111, and the second magnetic core 14 is partially attached on the first top surface 1111 of the first magnetic core 111 via the adhesive material 114, so that the first magnetic core 111 and the second magnetic core 112 are coupled with each other. The adhesive material 114 includes but not limited to a non-magnetic material with the relative magnetic permeability about 1 or a magnetic material with the relative magnetic permeability lager than 1. In the embodiment, the first magnetic core 111 is an I-type magnetic core, and the second magnetic core 112 is a U-type magnetic core. Alternatively, the second magnetic core 112 is an I-type or E-type magnetic core and the first magnetic core 111 is a U-type or E-type magnetic core. The first magnetic core 111 and the second magnetic core 112 are formed by a ferrite, a magnetic gel, an iron powder, a low temperature co-fired ceramic or a metallic magnetic material, and them are not limited to be constructed by the same material. Namely, the first magnetic core 111 and the second magnetic core 112 can be constructed by suitable materials according to the application requirements. In the embodiment, the first upper conductive element 131, the first sidewall conductive element 133 and the first lower conductive element 132 of the first magnetic core 111 are constructed by a conductive material, which is formed by means of but not limited to chemical vapor deposition, sputtering, electroless plating, electroplating or sintering so as to obtain a single-layer or multi-layers structure. The conductive material can be selected from but not limited to copper, silver, nickel, gold, etc. In other embodiment, the first upper conductive element 131, the first sidewall conductive element 133 and the first lower conductive element 132 can be constructed by conductive composite materials, for example but not limited to conductive silver paste, formed by means of printing or spraying. Alternatively, the switching device 12 includes but not limited to a controllable component or an uncontrollable component, such as a metal oxide semiconductor field effect transistor or a diode. Alternatively, the switching device 12 can be a planar component or a vertical component. In other embodiment, the switching device 12 is a bare die.

Figure 3B:
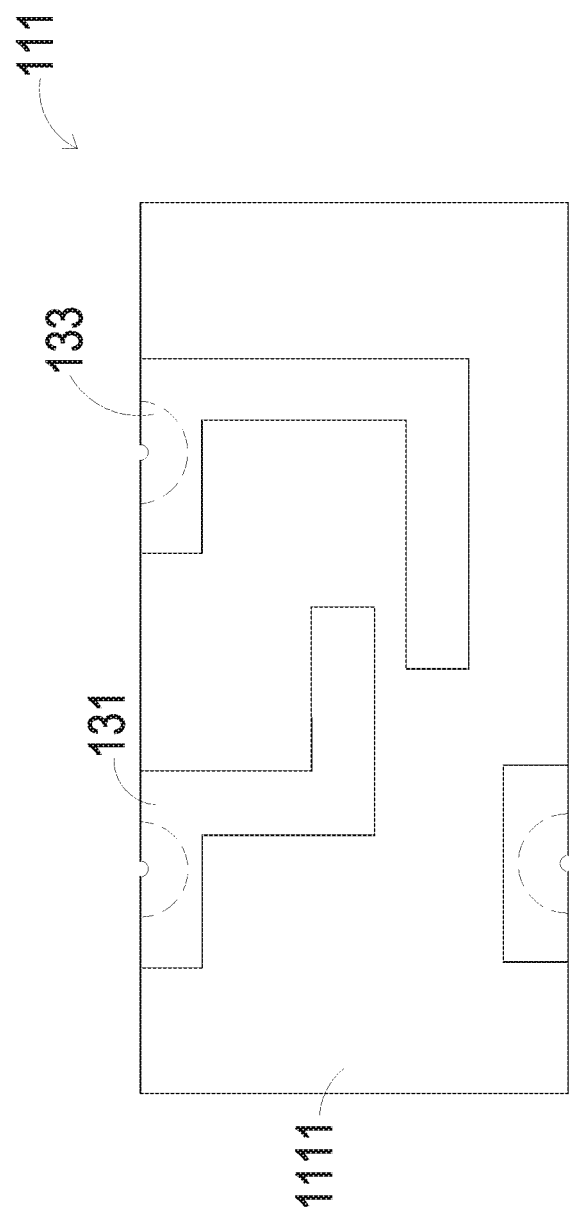
FIG. 3B is a top view illustrating the first magnetic core of the power module shown in FIG. 2.
Figure 3C:
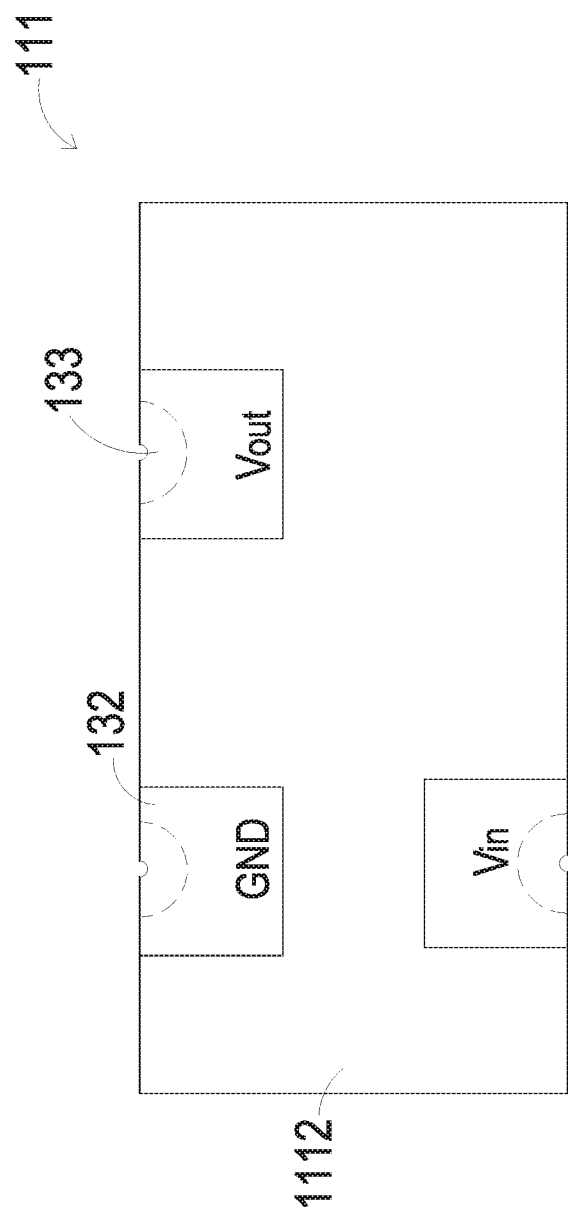
FIG. 3C is a bottom view illustrating the first magnetic core of the power module shown in FIG. 2.

FIG. 3A is a schematic cross-sectional view illustrating the first magnetic core of the power module shown in FIG. 2. FIG. 3B is a top view illustrating the first magnetic core of the power module shown in FIG. 2. FIG. 3C is a bottom view illustrating the first magnetic core of the power module shown in FIG. 2. As shown in FIGS. 2, and 3A to 3C, in the embodiment, the switching device 12 is a planar component, but it is not limited thereto. The switching device 12 includes at least a first electrode 1201. The first upper conductive element 131 disposed on the first top surface 1111 of the first magnetic core 111 has at least a terminal, as shown in FIG. 3B, electrically connected to the first electrode 1201 of the switching device 12. Alternatively, the first upper conductive element 131 further includes at least an electrically connecting trace, and a part of the traces electrically connected to a part of the terminals. On the other hand, the first lower conductive element 132 disposed on the first bottom surface 1112 of the first magnetic core 111 includes plural terminals. A part of the terminals are utilized as pins, as shown in FIG. 3C, so that the power input/output terminals, the controlling and driving signal terminal and a part of the electrically connecting traces of the power module 1 are formed. In an embodiment, the first lower conductive element 132 is omitted from the first bottom surface 1112 of the first magnetic core 111, and the first sidewall conductive element 133 has at least a terminal, so as to integrate the power input/output terminals and the controlling and driving signal terminal of the power module 1. The first upper conductive element 131 and the first lower conductive element 132 are connected via the first sidewall conductive element 133 and have terminals located at several relative positions, which are adjustable according to the application requirements.

Figure 3D:
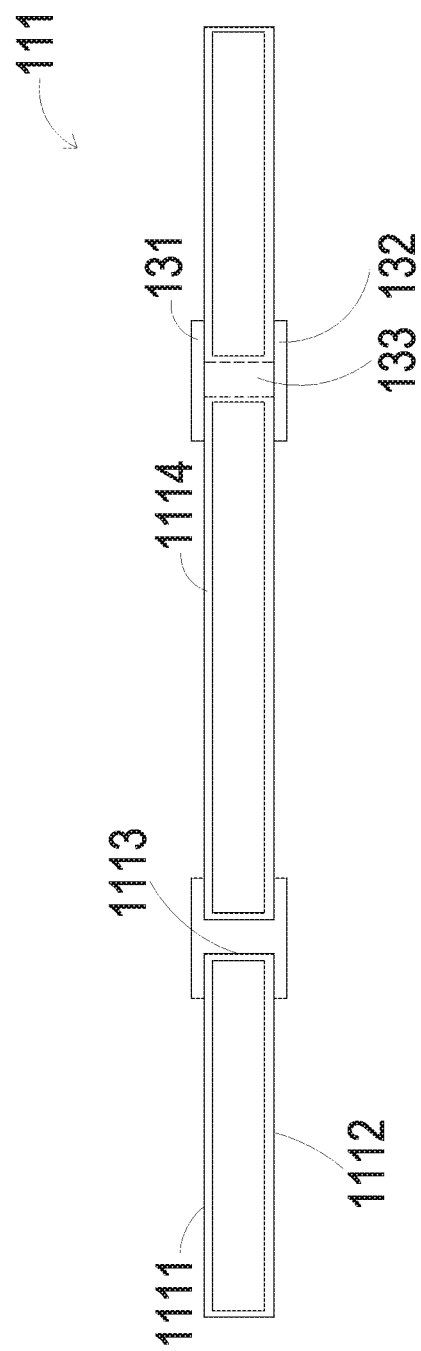
FIG. 3D is a cross-sectional view illustrating the first magnetic core according to another embodiment.

In some embodiment, for enhancing the electric insulation of the first magnetic core 111 or improving the withstanding voltage between the first magnetic core 111 and the first upper conductive element 131, the first sidewall conductive element 133 and the first lower conductive element 132, an insulating layer can be formed on the first top surface 1111, the first bottom surface 1112, and the surface of at least one first sidewall through-holes 1113 of the first magnetic core 111. FIG. 3D is a cross-sectional view illustrating the first magnetic core according to another embodiment. In the embodiment, the first magnetic core 111 further includes an insulating layer 1114 disposed on the first top surface 1111, the first bottom surface 1112, the surface of the at least one first sidewall through-hole 1113, so as to insulate the first magnetic core 111 from the first upper conductive element 131, the first sidewall conductive element 133 and the first lower conductive element 132. The insulating layer 1114 can be formed by a method including for example but not limited to lamination, printing, immersion, spraying or vapor deposition. The insulating layer 1114 disposed on the surface of the first sidewall through-hole 1113 can be formed by the above-mentioned method, or formed by means of drilling or cutting after the insulating material is filled in through-hole. Similarly, the second magnetic core 112 have an insulating layer 1114 the same as that of the first magnetic core 111, and it is not redundantly described herein.

Figure 4B:
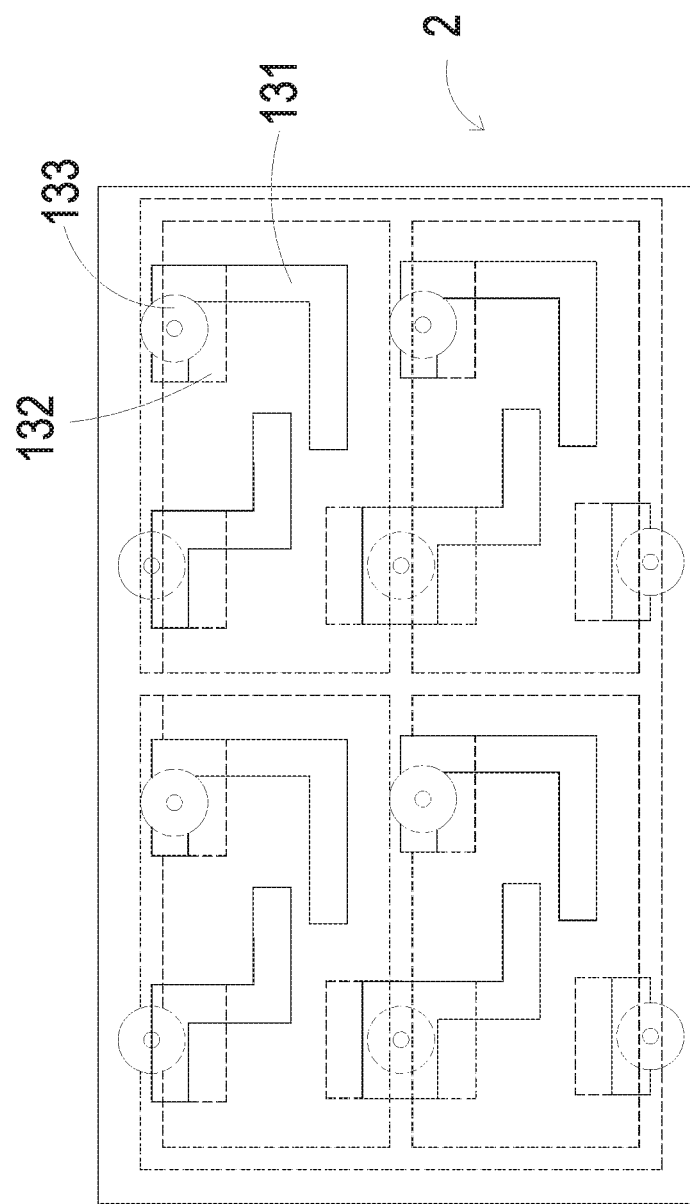
Figure 4C:
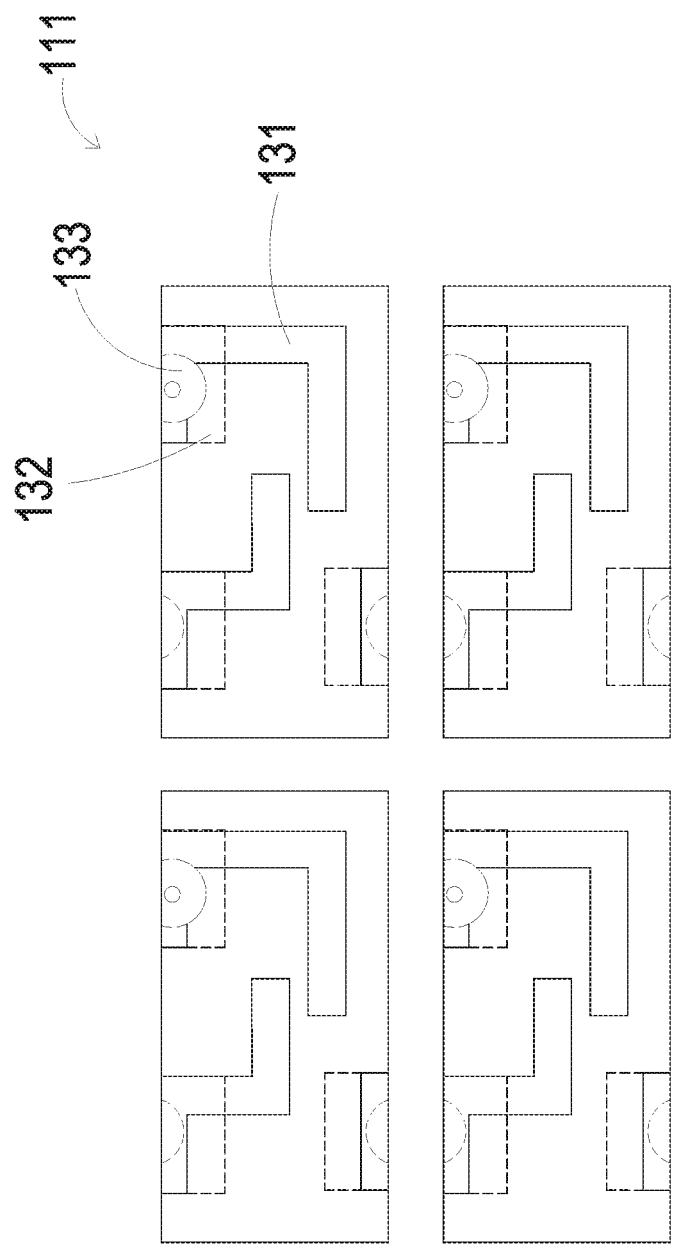

In the above embodiments, the first upper conductive element 131 and the first lower conductive element 132 are electrically connected with each other through the first sidewall conductive element 133, and the first upper conductive element 131, the first lower conductive element 132 and the first sidewall conductive element 133 form the electrically conductive path on the first magnetic core 111. Consequently, the power module 1 can go into mass production by a panel manufacturing process. FIGS. 4A to 4C schematically illustrate the structure of the power module in different steps according to a manufacturing process of the present invention. Firstly, a magnetic substrate 2 having a larger area is provided. The size of the magnetic substrate 2 is much larger than that of the first magnetic core 111 of the magnetic assembly 11. As shown in FIG. 4A, the dotted lines illustrate a routing zone for the removing area, and the distance between two dotted lines illustrates the width of the removing area to be cut by a cutter. In the embodiment, the magnetic substrate 2 can be divided into four (i.e. 2×2=4) first magnetic core 111 of the power module 1. Namely, each first magnetic core 111 of the magnetic assembly 11 has an area equal to a closed area defined by the dotted line frame shown in FIG. 4A. Then, at least one through-hole 21 are formed on the positions corresponding to the at least one first sidewall through-hole 1113 by physical or chemical forming methods including for example but not limited to mechanical drilling, laser drilling, sandblasting drilling, waterjet drilling, chemical etching or plasma etching. Then, an upper conductive metal layer and a lower conductive metal layer (not shown) are formed on the top surface and the bottom surface by means of for example but not limited to electroless plating or sputtering. In the embodiment, the upper conductive metal layer and the lower conductive metal layer are formed by a single material or a single layer, but it is not limited thereto. Alternatively, both of them can be constructed as a multilayer structure according to the different functional requirements so as to increase the bonding strength or prohibit the interaction between adjacent materials. Then, at least one conductive through-hole (not shown)

is formed in the through-hole 21 and the thicknesses of the upper conductive metal layer and the lower conductive metal layer are increased at the same time by for example but not limited to a copper plating process. In the embodiment, the conductive through-hole, the upper conductive metal layer and the lower conductive metal layer have the thicknesses ranged from 5 µm to 300 µm and provide excellent electrically conducting/thermally conducting properties. The through-hole 21 can be partially or completely filled with a conductive material. Alternatively, the through-hole 21 are partially filled with a conductive material and then constructed by an insulating material or a composite material for enhancing the structure, but it is not limited thereto. Afterward, a lithography and etching process is performed to selectively etch the upper conductive metal layer and the lower conductive metal layer through a protecting photoresist so as to define the required patterns of the first upper conductive element 131 and the first lower conductive element 132, as shown in FIG. 4B. Finally as shown in FIG. 4C, four first magnetic cores 111 of the power module 1 are obtained after cutting along two adjacent dotted lines by a cutter. Each first magnetic core 111 has an independent first upper conductive element 131, an independent first lower conductive element 132 and an independent first sidewall conductive element 133. Each first magnetic core 111 further combines with at least one switching device 12. The second magnetic core 112 is adhered on the first magnetic core 111 by the adhesive material 114 and the switching device 12 is accommodated in the receiving space 113. Consequently, the power module 1 as shown in FIG. 2 is constructed. In the embodiment, the sidewall of first magnetic core 111 and the first sidewall conductive element 133 are formed by means of cutting the magnetic substrate 2 along the arranged via hole 21, so that the mass production is simplified and a waste of space of the magnetic assembly is avoided. In addition, the power module 1 of the present invention has the first magnetic core 111 and the second magnetic core 112 integrated together. For obtaining the same inductance at the same plane size, one magnetic core has a thickness twice as thick as that of each one of the two magnetic cores. If the magnetic assembly is constructed by a single magnetic core merely, it will be more difficult to drill the single magnetic core. What's more, if single magnetic core is utilized, due to the limitation of the electroplating process, the diameters of the through-hole disposed in the magnetic core are increased obviously and a waste of space is caused. Except considering the manufacturing arts, if the magnetic assembly is constructed by a single magnetic core, the magnetic property is limited to the material of the magnetic core merely. The power module 1 has the magnetic assembly constructed by the first magnetic core 111 and the second magnetic core 112. Consequently, an air gap can be formed between the two magnetic cores or the different combinations of constructed materials can be utilized to create more variety of the design modification and optimize the entire properties.

Figure 5:
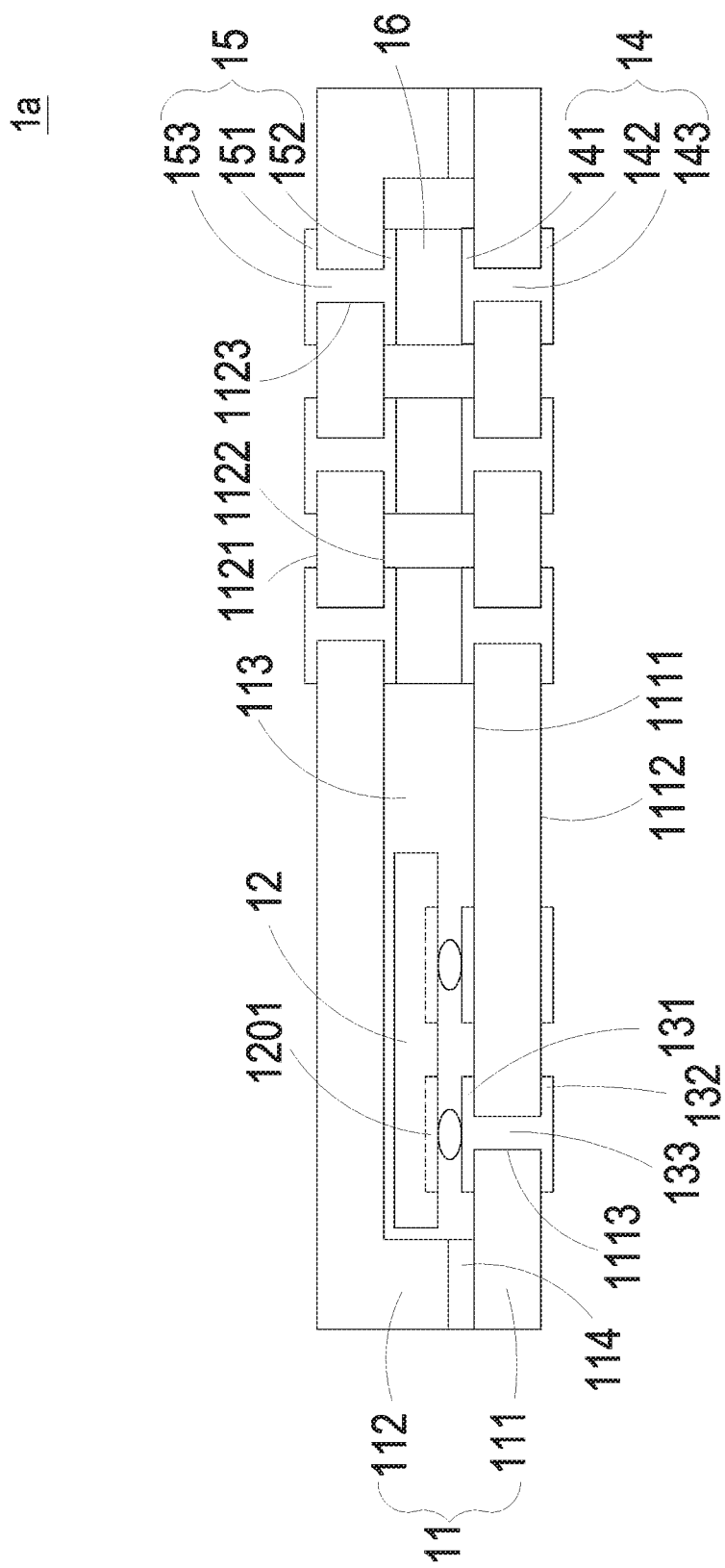
FIG. 5 is a schematic cross-sectional view illustrating a power module according to a second embodiment of the present invention.

FIG. 5 is a schematic cross-sectional view illustrating a power module according to a second embodiment of the present invention. In the embodiment, the structures, elements and functions of the power module 1a are similar to those of the power module 1 in FIG. 2, and are not redundantly described herein. Different from the power module 1 of FIG. 2, the power module 1a further includes a first series winding 14 and a second series winding 15 disposed on the first magnetic core 111 and the second magnetic core 112, respectively. The first series winding 14 includes a first upper winding set 141, a first lower winding set 142 and a first sidewall winding set 143. The first upper winding set 141 is disposed on the first top surface 1111 of the first magnetic core 111. The first lower winding set 142 is disposed on the first bottom surface 1112 of the first magnetic core 111. The first sidewall winding set 143 is disposed in the first sidewall through-holes 1113 located at two opposite sidewalls of the first magnetic core 111. The first upper winding set 141 and the first lower winding set 142 are connected with each other by the first sidewall winding set 143, so as to form the first series winding 14 in series. On the other hand, the second series winding 15 includes a second upper winding set 151, a second lower winding set 152 and a second sidewall winding set 153. The second upper winding set 151 is disposed on the second top surface 1121 of the second magnetic core 112. The second lower winding set 152 is disposed on the second bottom surface 1122 of the second magnetic core 112. The second sidewall winding set 153 is disposed in the second sidewall through-hole 1123 located at two opposite sidewalls of the second magnetic core 112. The second upper winding set 151 and the second lower winding set 152 are connected with each other by the second sidewall winding set 153, so as to form the second series winding 15 in series. The second series winding 15 in the second magnetic core 112 and the first series winding 14 in the first magnetic core 111 are electrically connected with each other through a conductive material 16. The first series winding 14 and the second series winding 15 are electrically connected in parallel or series. When the first series winding 14 and the second series winding 15 are electrically connected in parallel, the current capacity of the magnetic assembly 1a will be enhanced so as to decrease the winding loss. When the first series winding 14 and the second series winding 15 are electrically connected in series, the winding turns of the magnetic assembly 1a will be increased. In other embodiments, the first series winding 14 and the second series winding 15 can be electrically connected in hybrid serial-parallel connection according to the design, and it is not limited thereto. In addition, the first series winding 14 and the second series winding 15 can be constructed on the first magnetic core 111 and the second magnetic core 112 by a method the same as that of the above embodiment for constructing the first upper conductive element 131, the first lower conductive element 132 and the first sidewall conductive element 133 disposed on the first magnetic core 111, and are not redundantly described herein. Alternatively, in some embodiments, the switching device 12 and the first upper conductive element 131 are configured to form a winding turn.

Figure 6:
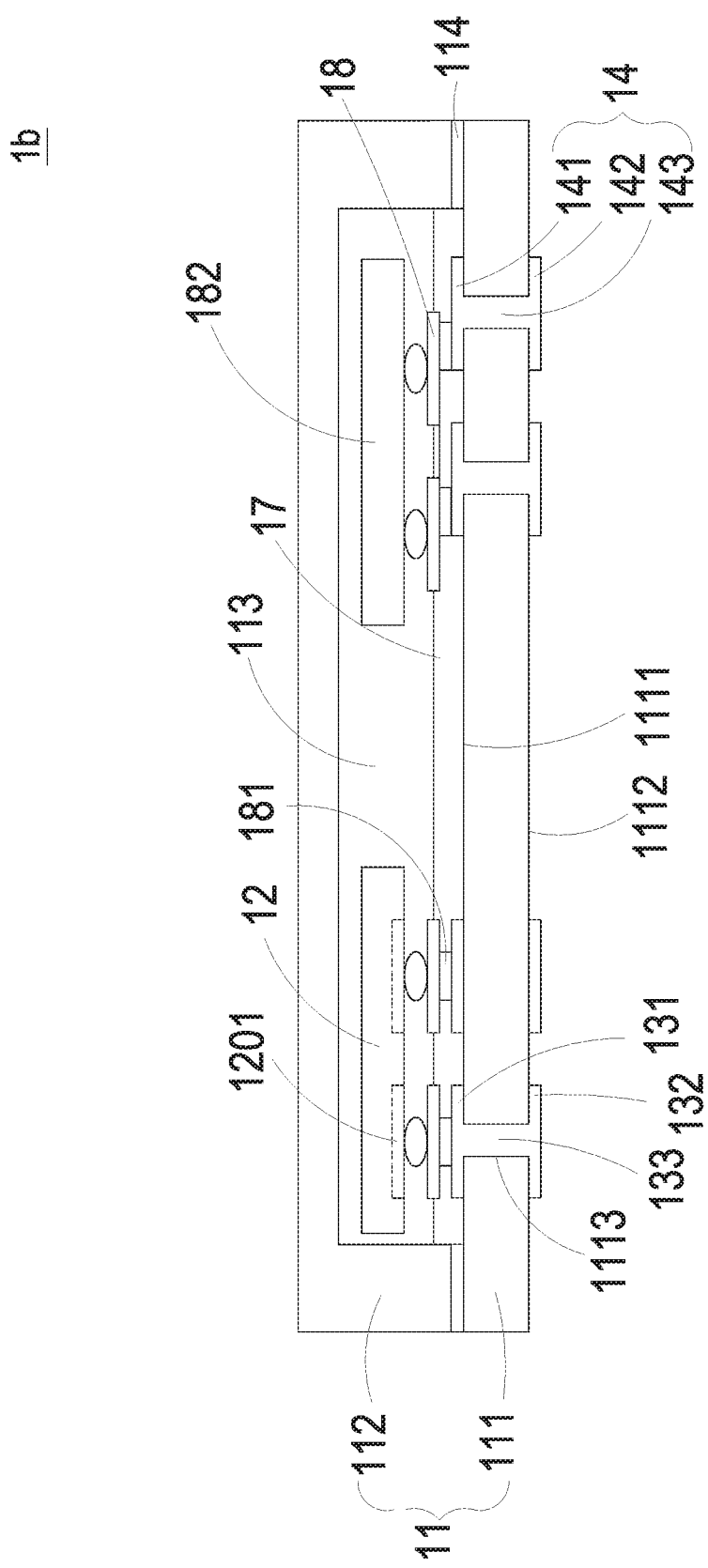
FIG. 6 is a schematic cross-sectional view illustrating a power module according to a third embodiment of the present invention.

FIG. 6 is a schematic cross-sectional view illustrating a power module according to a third embodiment of the present invention. In the embodiment, the structures, elements and functions of the power module 1b are similar to those of the power module 1a in FIG. 5, and are not redundantly described herein. Comparing with the power module 1a of FIG. 5, the power module 1b further includes an insulating dielectric layer 17 and a conductive layer 18. The insulating dielectric layer 17 is disposed on the first upper conductive element 131 and the first upper winding set 141 of the first series winding 14, and partially exposes the first upper conductive element 131 and the first upper winding set 141 of the first series winding 14 by means of drilling, so that a conductive blind via 181 can be constructed on the insulating dielectric layer 17 and electrically connected between the conductive layer 18 and the first upper conductive element 131 or between the conductive layer 18 and the first upper winding set 141 of the first series winding 14. The conductive layer 18 is electrically connected with the first upper conductive element 131 or the first series winding 14 in parallel or series for different purposes. The conductive layer 18 can be utilized for such as electromagnetic interference (EMI) shielding. When the first upper conductive element 131 is constructed as a power level, the conductive layer 18 has at least a portion for shielding, so that the leakage magnetic flux formed between the flowing current and the magnetic cores is avoided from sensitive circuits. Alternatively, in other embodiments, the conductive layer 18 is a connecting circuit between the switching device 12 and the first upper conductive element 131, or a passive component 182 is disposed on the conductive layer 18 and the conductive layer 18 and the passive component 182 are integrated in the receiving space 113, so as to accomplish a more complicated design. The present invention is not limited to the above embodiments, and it is not redundantly described herein.

Figure 7:
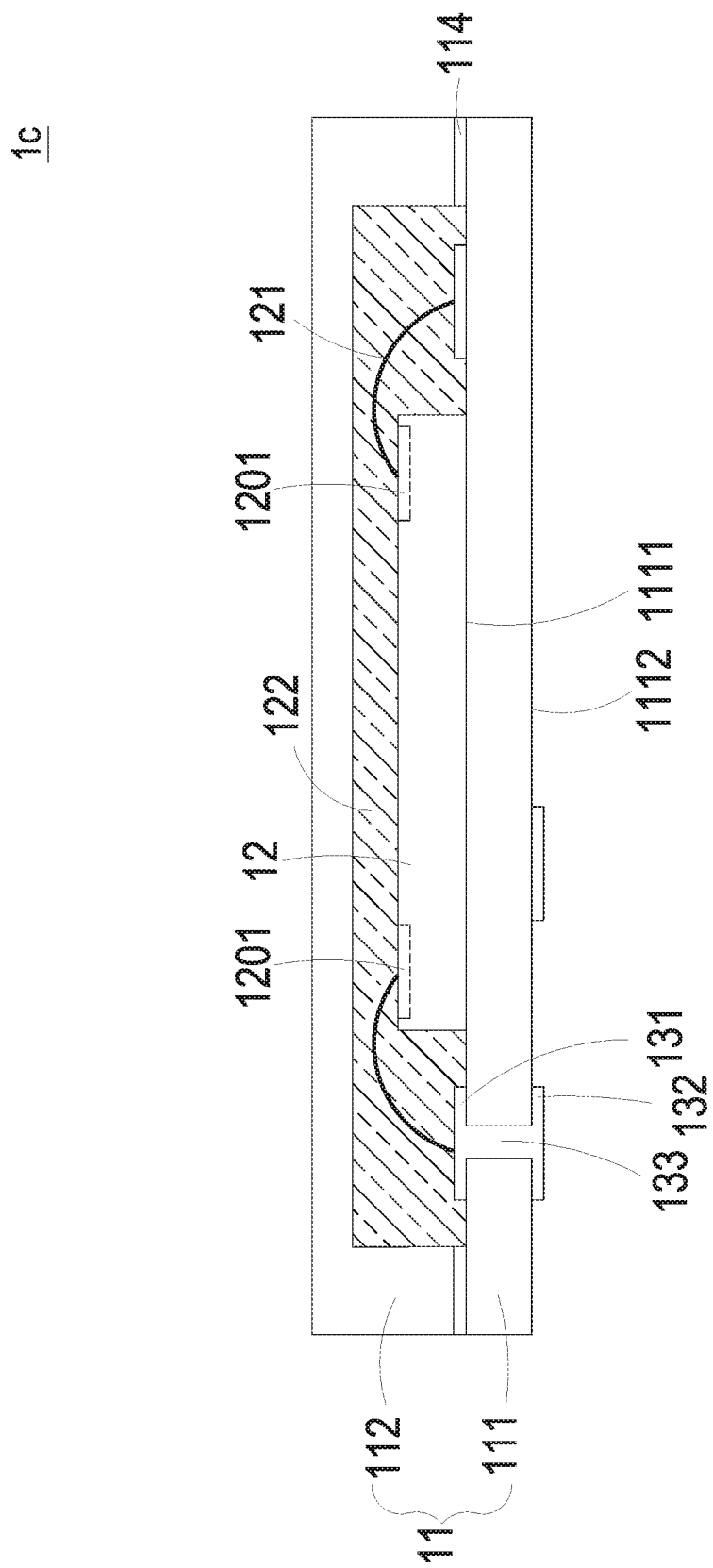
FIG. 7 is a schematic cross-sectional view illustrating a power module according to a fourth embodiment of the present invention.

FIG. 7 is a schematic cross-sectional view illustrating a power module according to a fourth embodiment of the present invention. In the embodiment, the structures, elements and functions of the power module 1c are similar to those of the power module 1b in FIG. 6, and are not redundantly described herein. Different from the power module 1b of FIG. 6 having a flip-chip switching device 12, the power module 1c have an integrated switching device 12 electrically connected to the first upper conductive element 131 via a bonding wire 121. The power module 1c further includes an insulating and encapsulation layer 122 covering the switching device 12, so as to package the switching device 12 in the receiving space 113 after the switching device 12 is disposed on the first magnetic core 111 and the second magnetic core 112 is adhered with the first magnetic core 111 via the adhesive material 114. When the molding process is performed, a film material can be formed on the first lower conductive element 132 disposed on the first bottom surface 1112 of the first magnetic core 111 for protecting. In addition, plural first magnetic cores 111 are produced on one panel by a method the same as that of the above embodiments, and the second magnetic core 112 can have a vent (not shown) for discharging the air during the molding package process. Alternatively, second sidewall through-hole 1123 (as shown in FIG. 5) connected between the upper conductive element and lower conductive element and fails to be filled completely is employed as the vent of the second magnetic core 112, and it is not limited thereto.

Figure 8:
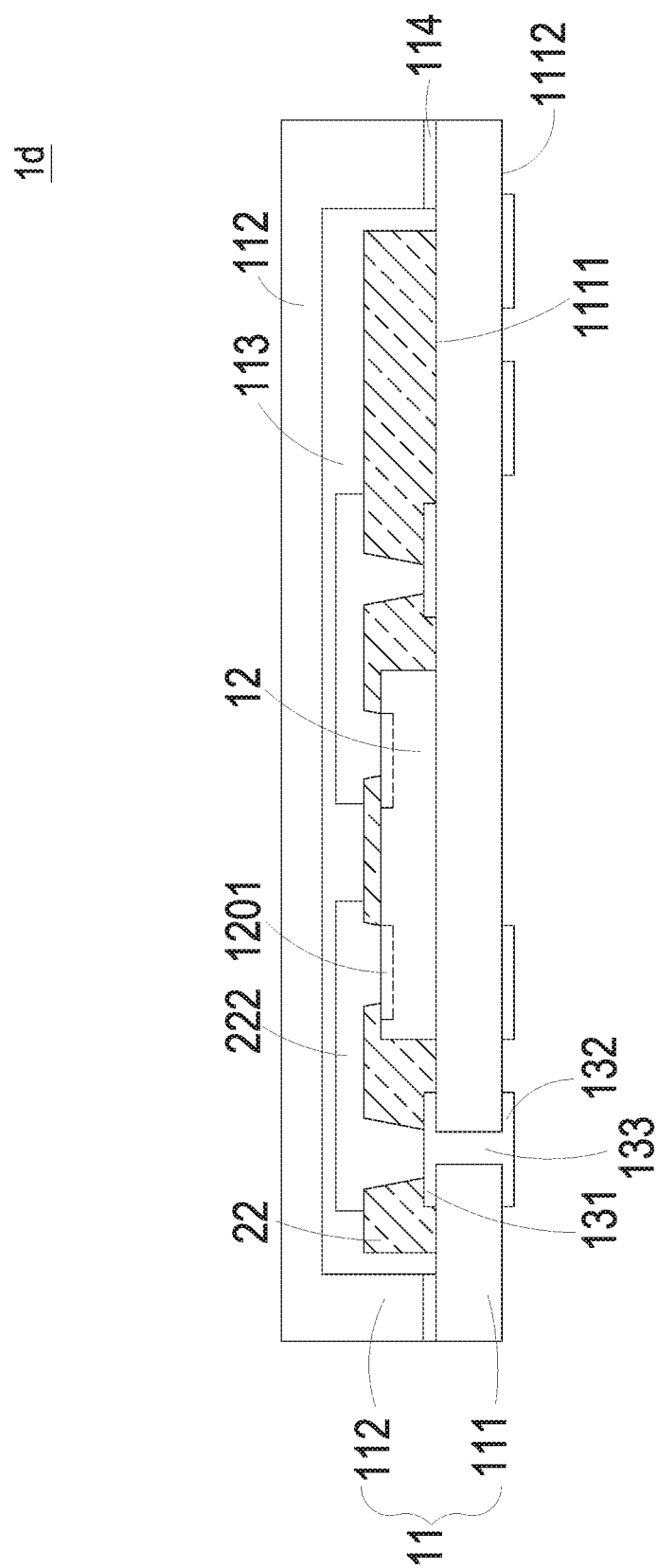
FIG. 8 is a schematic cross-sectional view illustrating a power module according to a fifth embodiment of the present invention.
Figure 9A:
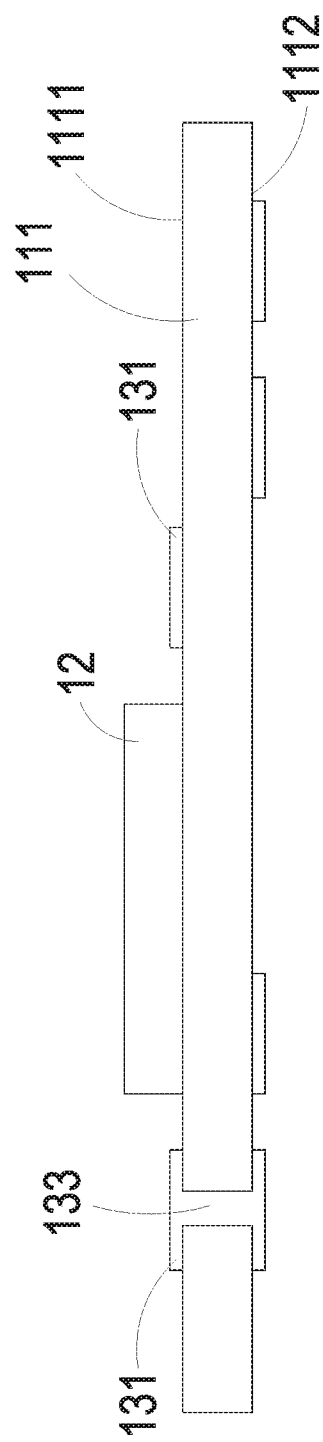
FIGS. 9A to 9D schematically illustrate the structure of the power module of FIG. 8 in different steps according a manufacturing process of the present invention.
Figure 9B:
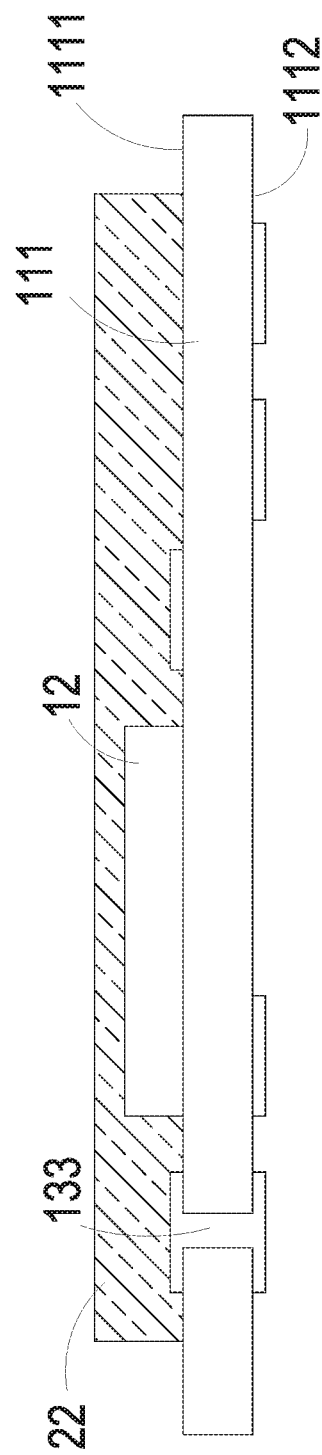
Figure 9C:
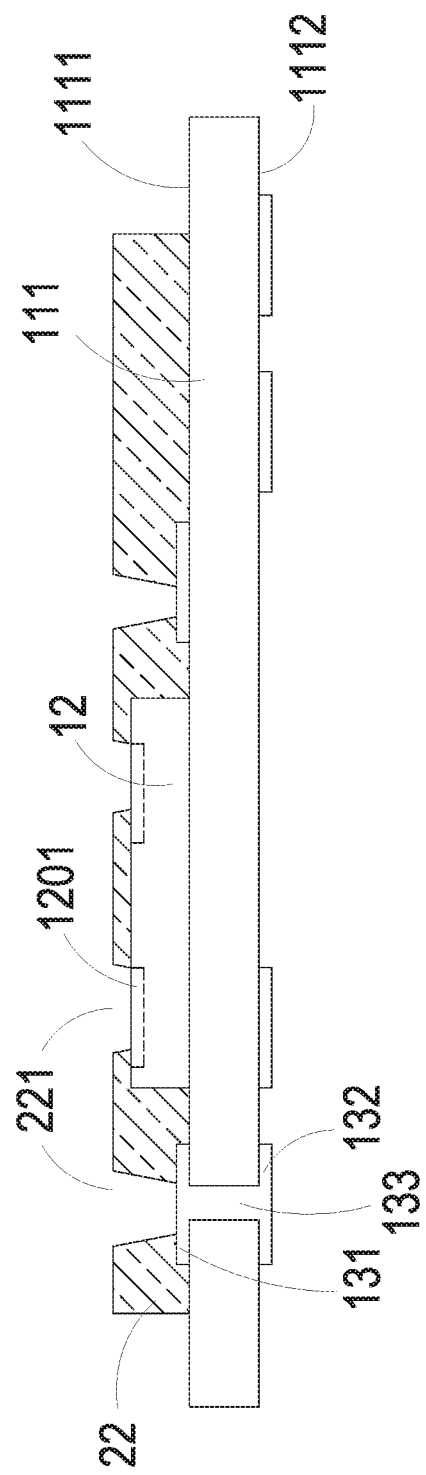
Figure 9D:
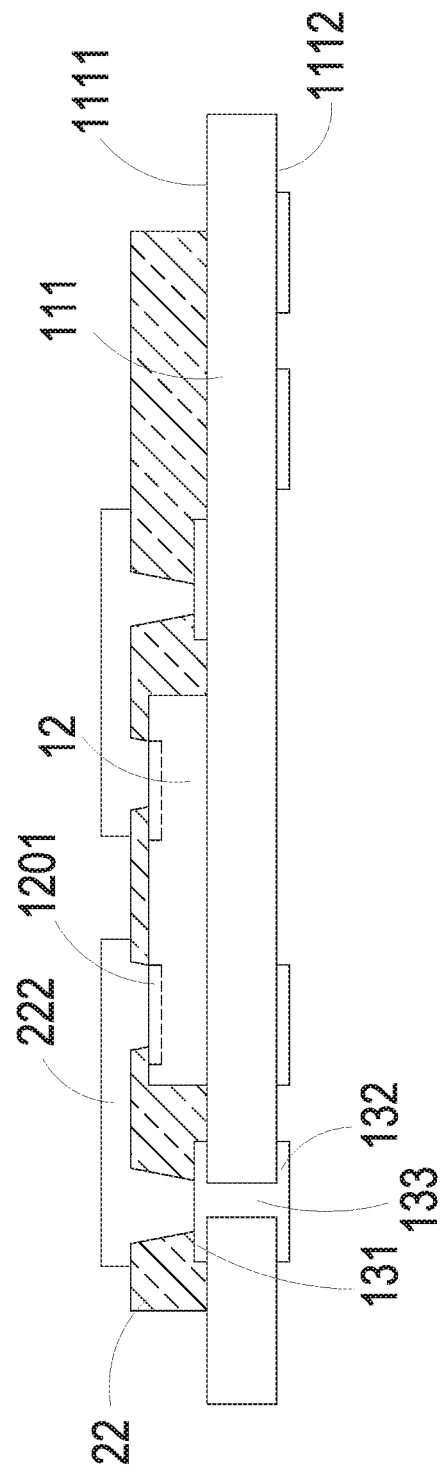

FIG. 8 is a schematic cross-sectional view illustrating a power module according to a fifth embodiment of the present invention. FIGS. 9A to 9D schematically illustrate the structure of the power module of FIG. 8 in different steps according to the manufacturing process of the present invention. In the embodiment, the structures, elements and functions of the power module 1d are similar to those of the power module 1b in FIG. 6, and are not redundantly described herein. Different from the power module 1b of FIG. 6, the power module 1d includes a switching device 12 which is assembled in the module with embedded process. Firstly, as shown in FIG. 9A, the switching device 12 is adhered and disposed on the first top surface 1111 of the first magnetic core 11 having the first upper conductive element 131, the first sidewall conductive element 133 and the first lower conductive element 132. The first upper conductive element 131, the first sidewall conductive element 133 and the first lower conductive element 132 are formed by a method the same as that of the embodiment described in FIGS. 4A to 4C, and it is not redundantly described herein. Then, as shown in FIG. 9B, an insulating layer 22 is formed on the first top surface 1111 of the first magnetic core 111 and covers the switching device 12 by means of for example but not limited to lamination, printing, heat pressing or spray coating, as shown in FIG. 9B. Then, a blind via 221 is formed by for example but not limited to laser drilling or mechanical drilling, so as to expose the portions of the first electrode 1201 of the switching device 12 and the first upper conductive element 131, as shown in FIG. 9C. The portions of a first electrode 1201 of the switching device 12 and the first upper conductive element 131 are exposed for the following metallization. Then, metal wires are formed and the blind via 221 is filled by a metallizing method for example but not limited to sputtering or electroplating, so as to form the connecting element 222, as shown in FIG. 9D. Finally, the first magnetic core 111 with the embedded switching device 12 is adhered with the second magnetic core 112 via the adhesive material 114. In the embodiment, the switching device 12 is integrated by means of embedding, so as to facilitate the implement of a multilayer-circuit structure, optimize the electrical properties, and integrate more additional functions, for example but not limited to electromagnetic interference (EMI) shielding. In addition, with the improvement of semi-conductor arts, the thickness of the embedded switching device 12 is getting thinner and even less than 50 μm. In the present invention, the first magnetic core 111 is utilized as a substrate, so as to provide sufficient mechanical strength for supporting. Accordingly, the switching device 12, such as a bare die, can be integrated in the magnetic assembly 11 of the present invention. In some embodiments, the insulating layer 22 can be formed and cover the entire surface of the first magnetic core 111. Redundant materials corresponding to the adhered area of the two magnetic cores can be removed in the following process by means of laser cutting, mechanical cutting, routing, etc. In other embodiments, the receiving space 113 disposed between the first magnetic core 111 and the second magnetic core 112 can further filled with an adhesive material with high viscosity or a magnetic paste with high permeability, but it is not limited thereto.

Figure 10:
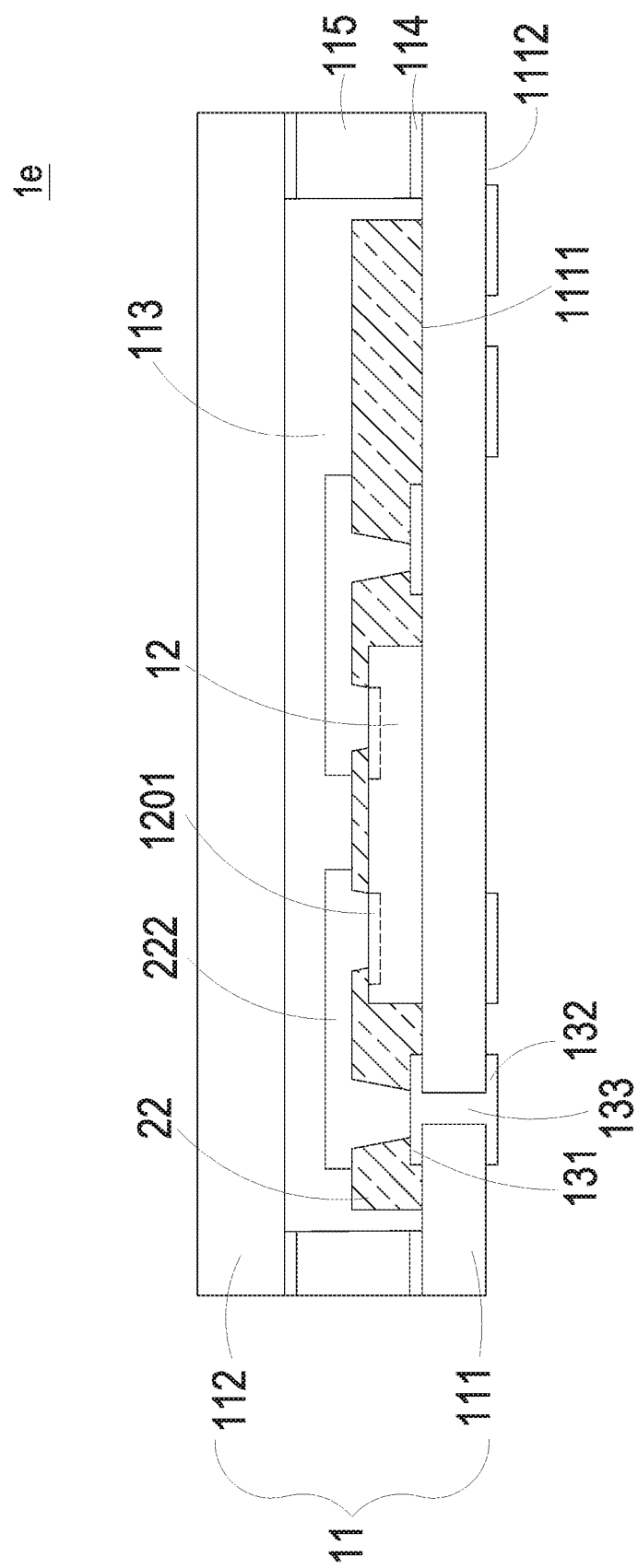
FIG. 10 is a schematic cross-sectional view illustrating a power module according to a sixth embodiment of the present invention.

FIG. 10 is a schematic cross-sectional view illustrating a power module according to a sixth embodiment of the present invention. In the embodiment, the structures, elements and functions of the power module 1e are similar to those of the power module 1d in FIG. 8, and are not redundantly described herein. Different from the power module 1d of FIG. 8, the power module 1e includes a magnetic assembly 11 constructed by a first magnetic core 111, a second magnetic core 112 and plural magnetic columns 115. The first magnetic core 111 and the second magnetic core 112 are I-type magnetic cores, and plural magnetic columns 115 are connected with the first magnetic core 111 and the second magnetic core 112 via the adhesive material 114. Comparing with the magnetic assembly 11 constructed by the I-type first magnetic core 111 and the U-type second magnetic core 112 in FIG. 8, the magnetic assembly 11 of the embodiment is constructed by the I-type first magnetic core 111 and the I-type second magnetic core 112 so as to facilitate controlling the size and forming the conductive elements on the second magnetic core 112. In addition, the thickness of the adhesive material 114 can be adjusted easily, so that the air gap of the magnetic assembly is controllable. Alternatively, the combination of the first magnetic core 111, the second magnetic core 112 and the plural magnetic columns 115 can be implemented in the above embodiments. The switching device 12 for example but not limited to a flip-chip, a wire-bonding, a planar, a vertical component is also disposed and integrated in the receiving space 113 formed by the first magnetic core 111 and the second magnetic core 112, and it is not redundantly described herein.

Figure 11:
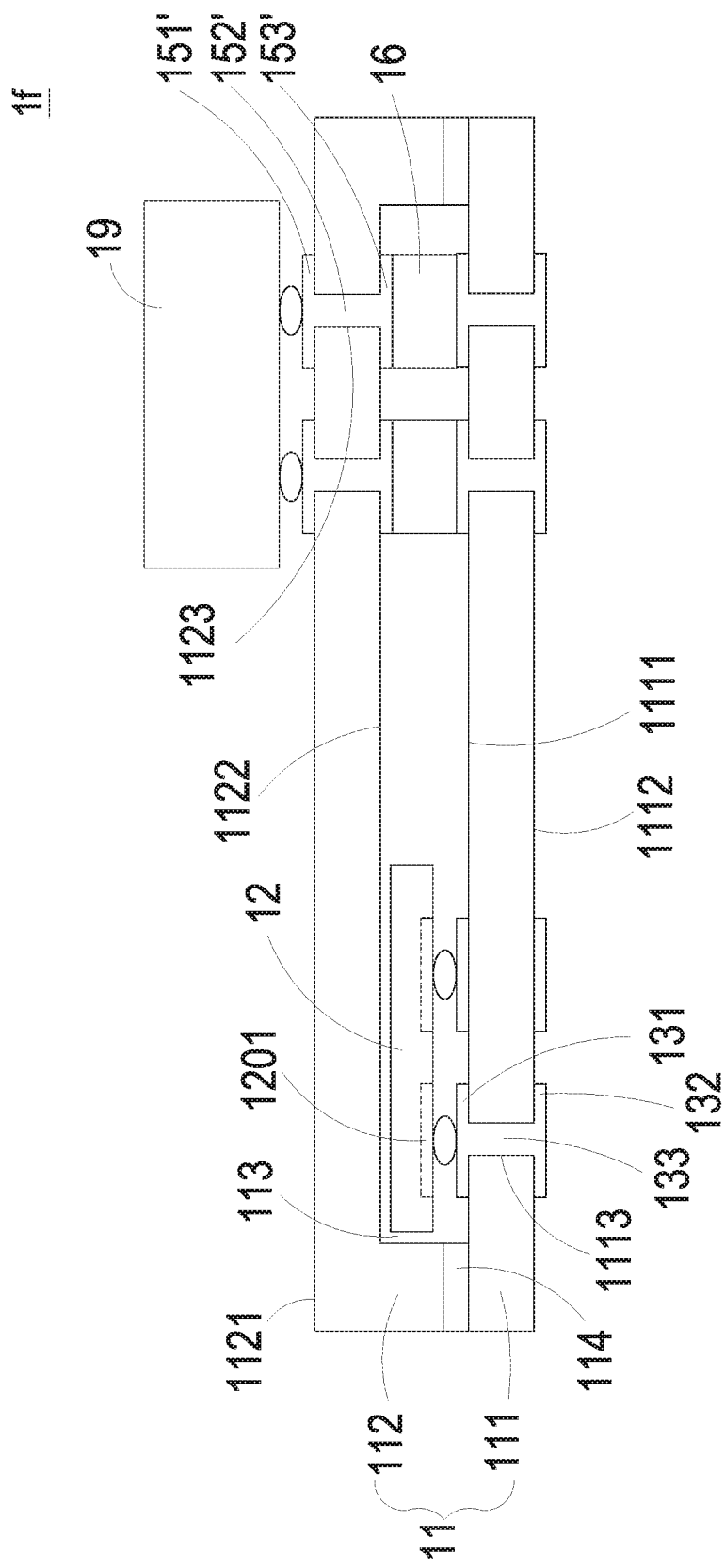
FIG. 11 is a schematic cross-sectional view illustrating a power module according to a seventh embodiment of the present invention.

FIG. 11 is a schematic cross-sectional view illustrating a power module according to a seventh embodiment of the present invention. In the embodiment, the structures, elements and functions of the power module 1f are similar to those of the power module 1a in FIG. 5, and are not redundantly described herein. Different from the power module 1a of FIG. 5, the power module 1f further includes an electronic component 19 disposed on the second top surface 1121 of the second magnetic core 112. In the embodiment, the electronic component 19 includes but not limited to a resistor, a capacitor, a power chip, or other periphery electronic components. When the electronic component 19 has a thickness larger than that of the receiving space 113 and fails to be accommodated in the receiving space 113, the electronic component 19 can be disposed on the second top surface 1121 of the second magnetic core 112 utilized as a substrate. On the other hand, in the embodiment, beside the first upper conductive element 131, the first sidewall conductive element 133 and the first lower conductive element 132 are disposed on the first magnetic core 111 of the power module 1f, the power module 1f further includes a second upper conductive element 151', a second sidewall conductive element 152' and a second lower conductive element 153' disposed on the second top surface 1121, disposed in the second sidewall through-hole 1123 and disposed on the second bottom surface 1122 of the second magnetic core 112, respectively. The first upper conductive element 131 and the second lower conductive element 153' are electrically connected with each other via a conductive material 16. Consequently, the power module 1f is integrated and the wiring density is increased. Namely, the first magnetic core 111 and the second magnetic core 112 have mechanical strength and can be utilized as a substrate, so that the receiving space 113 constructed by the magnetic assembly 11 can be adjusted according to the sizes of the switching device 12 and the additional electronic component 19 for accomplishing the package with high power density.

Figure 12:
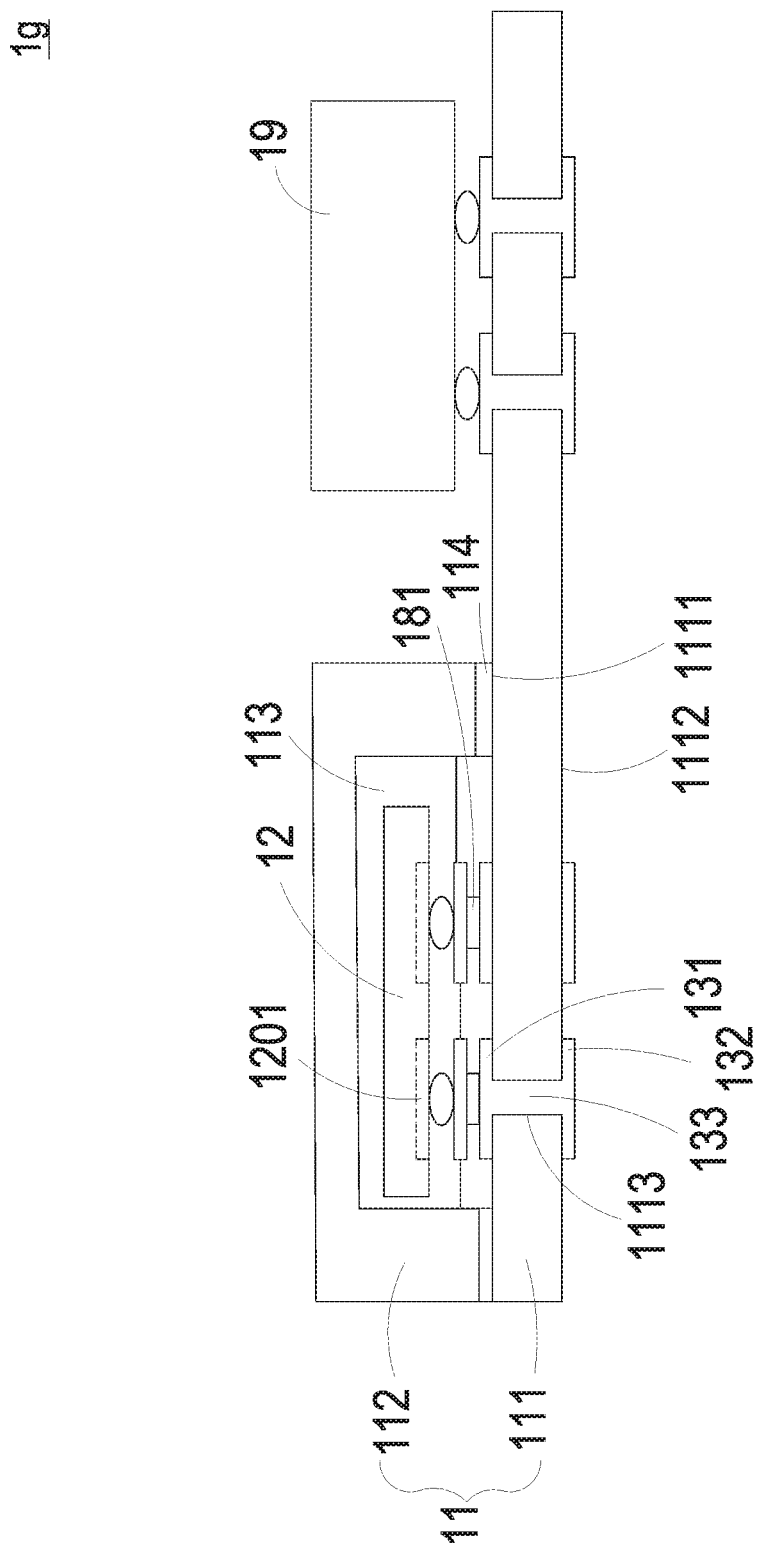
FIG. 12 is a schematic cross-sectional view illustrating a power module according to an eighth embodiment of the present invention.

FIG. 12 is a schematic cross-sectional view illustrating a power module according to an eighth embodiment of the present invention. In the embodiment, the structures, elements and functions of the power module 1g are similar to those of the power module 1b in FIG. 6, and are not redundantly described herein. Different from the power module 1b of FIG. 6, the power module 1g includes the magnetic assembly 11 constructed by the first magnetic core 111 and the second magnetic core 112 and the second magnetic core 112 is disposed on a partial area of the first top surface 1111 of the first magnetic core 111 so as to form the receiving space 113. In the embodiment, the power module 1g further includes an electronic component 19 disposed on the first top surface 1111 of the first magnetic core 111 and located at a position non-corresponding to the receiving space 113 and second magnetic core 112. The electronic component 19 is electrically connected to the first upper conductive element 131. In the embodiment, the electronic component 19 includes but not limited to a resistor, a capacitor, a power chip, or other periphery electronic components. In practical applications, when the electronic component 19 has a size or a thickness larger than that of the receiving space 113 and fails to be accommodated in the receiving space 113, the electronic component 19 can be disposed on the first top surface 1111 of the first magnetic core 111 utilized as a substrate. Consequently, the switching device 12 accommodated in the receiving space 113 and the electronic component 19 can be integrated together and disposed on the first top surface 1111 of the first magnetic core 111 for increasing the wiring density so that the entire thickness of the power module 1g is decreased and the competitiveness of the products is enhanced.

Figure 13:
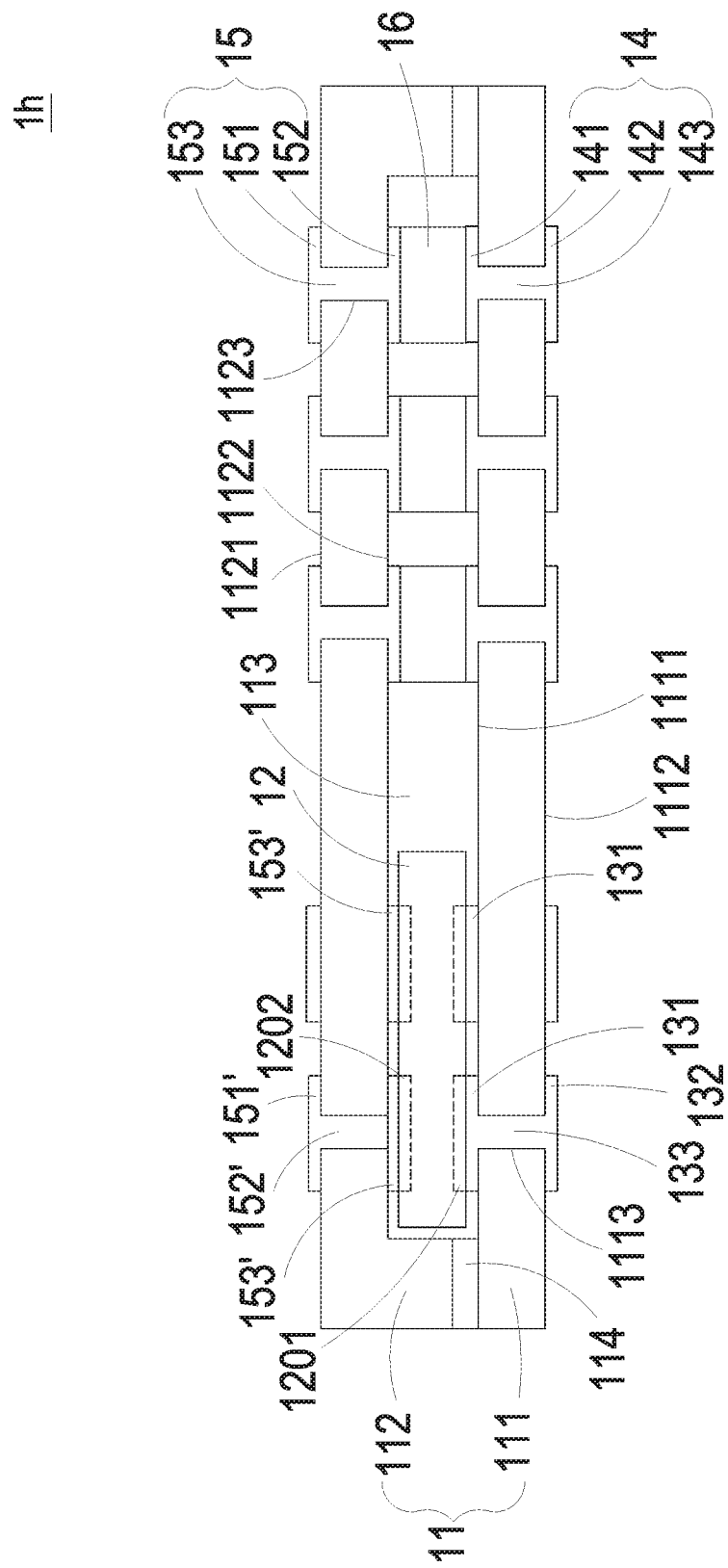
FIG. 13 is a schematic cross-sectional view illustrating a power module according to a ninth embodiment of the present invention.

FIG. 13 is a schematic cross-sectional view illustrating a power module according to a ninth embodiment of the present invention. In the embodiment, the structures, elements and functions of the power module 1h are similar to those of the power module 1a in FIG. 5, and are not redundantly described herein. Different from the power module 1a of FIG. 5, the power module 1h includes a vertical switching device 12. As shown in FIG. 13, the switch component 12 of the power module 1h has a first electrode 1201 disposed on the bottom surface thereof and electrically connected to the first upper conductive element 131 disposed on the first top surface 1111 of the first magnetic core 111 directly or indirectly via a conductive layer (not shown). In addition, the switch component 12 further has a second electrode 1202 disposed on the top surface thereof and electrically connected to the second lower conductive element 153' disposed on the second bottom surface 1122 of the second magnetic core 112 directly or indirectly via a conductive layer (not shown). The second electrode 1202 is opposite to the first electrode 1201 disposed on the bottom surface of the switching device 12 so as to form the vertical switching device 12. The switching device 12 has the first electrode 1201 and the second electrode 1202 electrically connected to the first upper conductive element 131 and the second lower conductive element 153' and respectively outputted from the bottom surface and the top surface thereof, but it is not limited thereto. In some embodiment, the first electrode 1201 disposed on the bottom surface and the second electrode 1202 disposed on the top surface of the switching device 12 can be electrically connected to the first upper conductive element 131 by for example but not limited to a bonding wire, a connecting element, or a solder layer. It is noted that the connection of the circuit is adjustable and not limited thereto. Similarly, the switching device 12 of FIGS. 2, 6, 7, 8, 10, 11 and 12 can be replaced as a vertical component and implemented as the same as that of the above embodiment according to the practical application.

Figure 14:
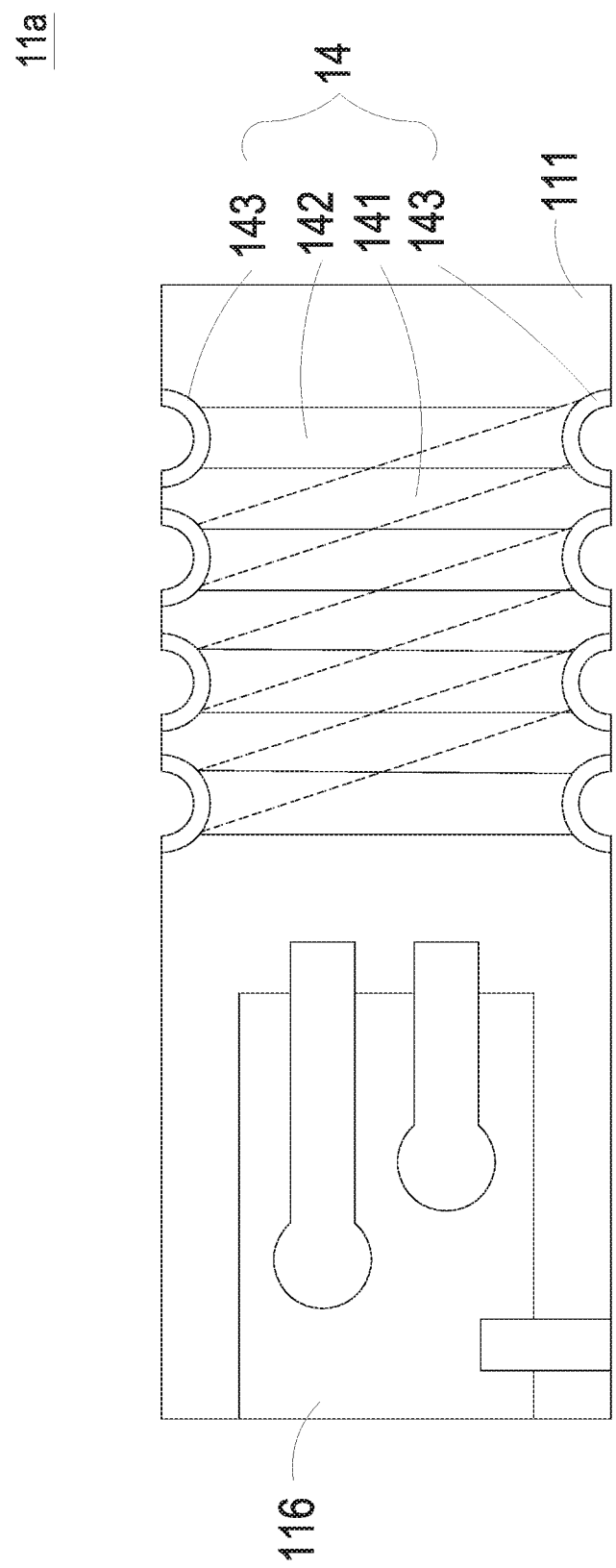
FIG. 14 is a schematic bottom view illustrating a magnetic assembly according to another embodiment of the present invention.

In the above embodiments, the first magnetic core 111 or the second magnetic core 112 of the magnetic assembly 11 is utilized as a substrate, so that other structural supporting element needn't to be employed and a waste of space will be avoided. On the other hand, for preventing from the issue of electro-magnetic interference, the first magnetic core 111 and the second magnetic core 112 include respectively integrated shielding layers for protecting. Alternatively, a non-magnetic zone can be formed in the first magnetic core 111 and the second magnetic core 112. FIG. 14 is a schematic bottom view illustrating a magnetic assembly according to another embodiment of the present invention. In the embodiment, the structures, elements and functions of the magnetic assembly 11a are similar to those of the magnetic assembly 11 in FIG. 5, and are not redundantly described herein. Different from the magnetic assembly 11 of FIG. 5, the first magnetic core 111 further includes a non-magnetic zone 116. A through hollow section is formed in the first magnetic core 111, and filled with a non-magnetic and insulating material so as to form the non-magnetic zone 116. Similarly, the non-magnetic zone 116 can have a circuit or a through-hole, so as to carry magnetic-sensitive switching devices, circuits or other devices thereon. The formation of the non-magnetic zone 116 isn't limited to the above embodiment. In other embodiments, the second magnetic core 112 of the magnetic assembly 11*a* has a corresponding non-magnetic zone the same as that of the first magnetic core 111, and it is not limited thereto. Similarly, the first magnetic core 111 and the second magnetic core 112 of the magnetic assembly 11 of FIGS. 6, 7, 8, 10, 11, 12 and 13 can have non-magnetic zones according to the practical application so as to implement as the application the same as that of the above embodiment.

In some embodiments, the integration of the electronic component and the inductor in a buck converter isn't limited. The semiconductor device and the magnetic assembly (i.e. the inductor) of the present invention are integrated and constructed to form the power module according to several applications. Simply speaking, the inductance value of the inductor is accomplished by a magnetic flux around a closed loop. The magnetic properties of the soft magnetic assembly are accomplished due to the magnetic flux based on the current around a closed loop. Namely, the magnetic field strength is equal to the integral of the current around a closed loop (i.e. the sum of the current around the closed loop), and the magnetic flux density is the magnetic reaction of magnetic materials to the magnetic field. Different from that the conventional magnetic assembly of the power module is constructed as an inductor independently, both of the upper switching device and the lower switching device are accommodated in a receiving space of the magnetic assembly, so as to accomplish an equivalent inductance with the circuit of the power module, but it is not limited thereto. Alternatively, different electronic components can be accommodated in the receiving space of the magnetic assembly so as to accomplish the equivalent inductance with the circuit of the power module. Namely, the power module of the present invention can be implemented in a circuit with inductance requirement by means of disposing the magnetic cores of the magnetic assembly at any place of the circuit, so that the circuit loop passes through the receiving space formed by the magnetic assembly and provides an equivalent cross-sectional area of the magnetic assembly at the same time. Therefore, it is not necessary to set an independent inductance winding and the power loss and the volume is reduced. In addition, the magnetic cores of the magnetic assembly and other electronic components of the circuit can be integrated with each other, so that the volume of the package structure is reduced. The power module of the present invention can be applied to several circuits with inductance requirement, for example but not limited to a boost circuit or a resonant circuit. Certainly, the present invention is not limited to the above embodiments.

In summary, the present invention provides a power module having the magnetic core utilized as a substrate for wiring, so that the structural supporting function is provided and the power module can accomplish high efficiency and high power density by means of integrating several chip components with different functions packaged between two magnetic cores of the magnetic assembly. Consequently, the occupied space of the power module relative to the system motherboard can be decreased so that the product with the power module is more competitive. In addition, the top surface, the bottom surface and the sidewall of the two magnetic cores can be utilized to form different series windings connected with each other in series or parallel thereon. When a circuit or winding is formed on the magnetic assembly via the sidewall through-hole, an electronic component can be integrated together. Furthermore, plural magnetic assemblies can be constructed by a large-size magnetic substrate at the same time so as to simplify the manufacturing process and avoid a waste of space utilized in the magnetic assembly by the structure of sidewall through-hole. The magnetic assembly can further have an air gap disposed between two magnetic cores for adjusting the magnetic properties thereof. The combination of the two magnetic cores can decrease the depth of through-hole and increase the wiring density. On the other hand, the magnetic assembly is utilized as a substrate, so as to provide the mechanical strength, decrease the entire thickness of the power module and enhance the competitiveness of the products. On the other hand, the magnetic assembly constructed by two magnetic cores can be utilized to provide a receiving space for integrating electronic components therein and can be adjusted corresponding to the application requirements of the power module, so as to adjust the magnetic property of the magnetic assembly and create more variety of the design modification. Multi surfaces are provided for wiring in multilayers and facilitating optimizing the circuit characteristics and integrating more functions in the power module.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power module comprising:
    a magnetic assembly having a first magnetic core, a second magnetic core and a receiving space, wherein the first magnetic core has a first top surface, a first bottom surface and at least one first sidewall through-hole, the second magnetic core is coupled with the first magnetic core, and the receiving space is formed between the first magnetic core and the second magnetic core;
    at least a switching device having a first electrode, wherein the switching device is disposed on the first top surface of the first magnetic core and accommodated in the receiving space;
    a first upper conductive element disposed on the first top surface of the first magnetic core and electrically connected to the first electrode of the switching device; and
    a first sidewall conductive element disposed in the first sidewall through-hole and electrically connected to the first upper conductive element.

2. The power module according to claim 1, wherein the magnetic assembly further comprises a first lower conductive element disposed on the first bottom surface of the first magnetic core and electrically connected to the first sidewall conductive element.

3. The power module according to claim 2, wherein the first lower conductive element includes at least one pin.

4. The power module according to claim 1, wherein the second magnetic core is a magnetic gel disposed on the first top surface of the first magnetic core.

5. The power module according to claim 1, wherein the switching device is a bare die.

6. The power module according to claim 1, wherein the switching device is a controllable component or an uncontrollable component.

7. The power module according to claim 1, further comprising a passive component disposed on the first top surface of the first magnetic core and accommodated in the receiving space.

8. The power module according to claim 1, wherein the switching device further comprises a second electrode electrically connected to the first upper conductive element.

9. The power module according to claim 1, wherein the magnetic assembly further comprises an adhesive material disposed on a portion of the first top surface of the first magnetic core and adhered between the first magnetic core and the second magnetic core, wherein the adhesive material is formed by a non-magnetic material or a magnetic material.

10. The power module according to claim 1, wherein the magnetic assembly comprises at least one air gap disposed between the first magnetic core and the second magnetic core.

11. The power module according to claim 1, wherein the second magnetic core comprises a second top surface, a second bottom surface and at least one second sidewall through-hole, and the power module further comprises:
a second upper conductive element disposed on the second top surface of the second magnetic core;
a second lower conductive element disposed on the second bottom surface of the second magnetic core; and
a second sidewall conductive element disposed in the second sidewall through-hole and electrically connected between the second upper conductive element and the second lower conductive element.

12. The power module according to claim 11, further comprising an electronic component disposed on the second top surface or the second bottom surface of the second magnetic core.

13. The power module according to claim 11, wherein the magnetic assembly comprises at least one insulated layer disposed on the first top surface and the first bottom surface and disposed in the first sidewall through-hole, so as to insulate the first magnetic core from the first upper conductive element and the first sidewall conductive element, or disposed on the second top surface and the second bottom surface and disposed in the second through-hole, so as to insulate the second magnetic core from the second upper conductive element, the second lower conductive element and the second sidewall conductive element.

14. The power module according to claim 1, further comprising an electronic component disposed on the first top surface or the first bottom surface and located at a position out of the receiving space.

15. The power module according to claim 1, wherein the first magnetic core or the second magnetic core further comprises a through hollow section formed by a non-magnetic material and configured to form a non-magnetic zone.

16. The power module according to claim 1, further comprising at least a first series winding, wherein the first series winding comprises:
a first upper winding set disposed on the first top surface of the first magnetic core;
a first lower winding set disposed on the first bottom surface of the first magnetic core; and
a first sidewall winding set disposed in the first sidewall through-hole, wherein the first upper winding set and the first lower winding set are electrically connected with each other by the first sidewall winding set, so as to form the first series winding in series.

17. The power module according to claim 16, further comprising at least a second series winding, wherein the second series winding comprises:
a second upper winding set disposed on the second top surface of the second magnetic core;
a second lower winding set disposed on the second bottom surface of the second magnetic core; and
a second sidewall winding set disposed in the second sidewall through-hole, wherein the second upper winding set and the second lower winding set are electrically connected with each other by the second sidewall winding set, so as to form the second series winding in series, and the first series winding and the second series winding are electrically connected in parallel or series.

18. The power module according to claim 1, further comprising:
an insulating dielectric layer disposed on the first upper conductive element; and
a conductive layer disposed on the insulating dielectric layer and electrically connected to the first upper conductive element.

19. The power module according to claim 1, further comprising an insulating and encapsulation layer disposed on the first top surface of the first magnetic core and covering the switching device, so as to package the switching device in the receiving space.

20. The power module according to claim 1, wherein the magnetic assembly further comprises plural magnetic columns connected with the first magnetic core and the second magnetic core, wherein the receiving space is formed by the first magnetic core, the second magnetic core and plural magnetic columns.

* * * * *